(12) United States Patent
Ha et al.

(10) Patent No.: US 11,189,667 B2
(45) Date of Patent: Nov. 30, 2021

(54) DISPLAY MICROPHONE DEVICE

(71) Applicant: LG Display Co., Ltd., Seoul (KR)

(72) Inventors: Tai-Hyeon Ha, Paju-si (KR);
Hwa-Young Kim, Paju-si (KR);
Yeon-Kwan Jung, Paju-si (KR);
Gi-Moon Jeong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 174 days.

(21) Appl. No.: 16/721,538

(22) Filed: Dec. 19, 2019

(65) Prior Publication Data

US 2020/0212136 A1  Jul. 2, 2020

(30) Foreign Application Priority Data

Dec. 28, 2018  (KR) .................. 10-2018-0172126

(51) Int. Cl.
*H01L 27/32* (2006.01)
*H04R 1/04* (2006.01)
*G06F 1/16* (2006.01)

(52) U.S. Cl.
CPC ........ *H01L 27/3225* (2013.01); *G06F 1/1605* (2013.01); *H04R 1/04* (2013.01)

(58) Field of Classification Search
CPC .............. H01L 27/3225; H01L 51/524; H01L 27/3276; H01L 27/3297; H01L 27/3288; H01L 27/3223; H04R 1/04; H04R 1/028; H04R 2499/15; H04R 19/04; H04R 9/08; H04R 1/08; G06F 1/1605; G06F 1/1684; G06F 1/1637; G06F 9/33; G06F 2200/1612; G09G 3/3208

See application file for complete search history.

(56) References Cited

U.S. PATENT DOCUMENTS

2014/0239802 A1 * 8/2014 Lee .................. H04R 17/02
313/504
2020/0204893 A1 * 6/2020 Lee .................. H04R 9/04

FOREIGN PATENT DOCUMENTS

| JP | 2018026774 A | * | 2/2018 |
| JP | 2018026774 A |   | 2/2018 |
| KR | 100698256 B1 |   | 3/2007 |
| KR | 20090128689 A | * | 12/2009 |

* cited by examiner

*Primary Examiner* — Yogeshkumar Patel
(74) *Attorney, Agent, or Firm* — Seed Intellectual Property Law Group LLP

(57) ABSTRACT

A display microphone device includes a display panel having a front surface from which light is emitted and a rear surface opposite the front surface. A front electrode is coupled to the rear surface of the display panel, a rear electrode faces and is spaced apart from the front electrode. A power supply is connected to the front electrode and the rear electrode. The display microphone device outputs an audio signal based on a change in a voltage between the front electrode and the rear electrode.

12 Claims, 5 Drawing Sheets

DISPLAY MICROPHONE DEVICE

CROSS-REFERENCE TO RELATED APPLICATIONS

The present application claims the benefit of Korean Patent Application No. 10-2018-0172126 filed in the Republic of Korea on Dec. 28, 2018, which is hereby incorporated by reference into the present application.

BACKGROUND

Technical Field

The present disclosure relates to a display device, and more particularly, to a display device implementing a microphone using a display panel.

Description of the Related Art

In recent years, flat panel displays such as a liquid crystal display (LCD) device and an organic light emitting diode (OLED) display device have been developed and are in the spotlight. Flat panel displays have advantages of thinner, lighter, and lower power consumption than CRTs.

The OLED display device displays images using an organic light emitting diode having self-luminous characteristics. The organic light emitting diode is composed of a hole injection electrode, an organic light emitting layer, and an electron injection electrode. Electrons and holes combine with each other in the organic light emitting layer to produce excitons, and light is emitted by energy generated when the excitons change from excited state to ground state.

Since the OLED display device does not require a back light unit, unlike the LCD device, thickness and weight of the OLED display device can be reduced. In addition, since the OLED display device has low power consumption and high luminance and response time, it can be used in various devices such as TVs, monitors, smartphones, smart watches, and the like.

BRIEF SUMMARY

Accordingly, embodiments of the present disclosure are directed to a display device implementing a microphone using a display panel.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display microphone device comprises a display panel having a front surface from which light is emitted and a rear surface opposite the front surface, a front electrode coupled to the rear surface of the display panel, a rear electrode facing and spaced apart from the front electrode, and a power supply connected to the front electrode and the rear electrode. The display microphone device outputs an audio signal based on a change in a voltage between the front electrode and the rear electrode.

In another aspect, a display microphone device comprises a display panel having a front surface from which light is emitted and a rear surface opposite the front surface, and an electromagnet including a magnetic core and a coil wound around the core a plurality of times. The electromagnet is coupled to the rear surface of the display panel and outputs an audio signal based on a change in a current generated from the coil.

It is to be understood that both the foregoing general description and the following detailed description are exemplary and explanatory and are intended to provide further explanation of the inventive concepts as claimed.

BRIEF DESCRIPTION OF THE SEVERAL VIEWS OF THE DRAWINGS

The accompanying drawings, which are included to provide a further understanding of the disclosure and are incorporated and constitute a part of this application, illustrate embodiments of the disclosure and together with the description serve to explain various principles.

DETAILED DESCRIPTION

Reference will now be made in detail to the preferred embodiments, examples of which are illustrated in the accompanying drawings.

Figure 1:
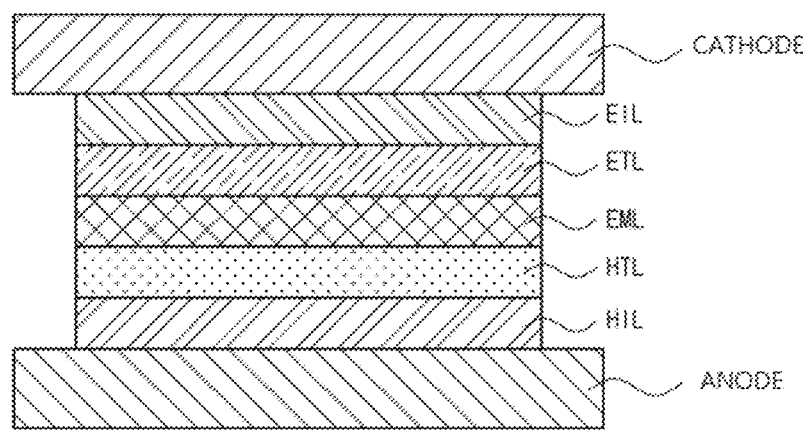
FIG. 1 is a schematic cross-sectional view of an OLED.

FIG. 1 is a schematic cross-sectional view of an OLED.

As shown in FIG. 1, a hole injection layer HIL is on a first electrode ANODE which is a positive electrode. A hole transporting layer HTL is on the hole injection layer HIL and under an emissive layer EML. The hole injection layer HIL and the hole transporting layer HTL transport holes from the first electrode ANODE to the emissive layer EML.

An electron transporting layer ETL is on the emissive layer EML. An electron injection layer EIL is on the electron transporting layer ETL and under a second electrode CATHODE which is a negative electrode. The electron injection layer EIL and the electron transporting layer ETL transport electrons from the second electrode CATHODE to the emissive layer EML.

When the electrons and holes are paired in the emissive layer EML and then change from excited state to ground state, energy is generated and light is emitted. Some of the lights generated in the emissive layer EML may reflect at interfaces of the layers of the OLED and at the first electrode ANODE and the second electrode CATHODE. Reflected lights may interfere with each other.

An OLED display panel may vibrate finely by sounds generated from the outside of the OLED display panel. Sound waves may increase interferences between the lights by changing phases of the lights reflected at the interfaces of the layers of the OLED. When constructive interference occurs, resonance may occur and vibration may further increase in the OLED display panel. In the embodiments of the present disclosure, a microphone can be implemented by using the vibration characteristic of the OLED display panel.

Figure 2:
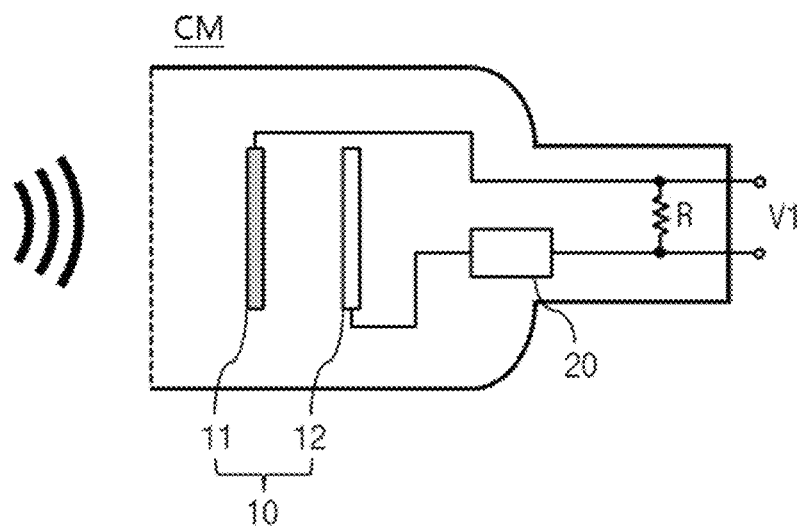
FIG. 2 is a schematic view showing a structure of a condenser microphone.

FIG. 2 is a schematic view showing a structure of a condenser microphone.

A capacitance of a capacitor including two flat plate-shaped electrodes is changed by sound. A condenser microphone can be implemented by using a characteristic in which the capacitance of the capacitor changes.

As shown in FIG. 2, the condenser microphone CM includes a capacitor 10 and a power supply 20. The capacitor 10 may include a front electrode 11 and a rear electrode 12, which are flat plate-shaped electrodes. The rear electrode 12 is connected to the power supply 20. In order to change the capacitance of the capacitor 10, the front electrode 11 may be a diaphragm made of a conductive material.

A sound generated from the outside of the condenser microphone CM vibrates the front electrode 11, which is a diaphragm made of a conductive material. Accordingly, a distance between the front electrode 11 and the rear electrode 12 is changed, and the capacitance of the capacitor 10 is changed.

When no voltage is applied to the capacitor 10, the capacitance of the capacitor 10 does not change even if the distance between the front electrode 11 and the rear electrode 12 changes due to the sound generated from the outside of the condenser microphone CM. Therefore, the condenser microphone CM includes a device for applying power to the capacitor 10. The power supply 20 is connected to the rear electrode 12 to apply a voltage to the capacitor 10. The power supply 20 may be a battery built in the condenser microphone CM or a DC power source located the outside of the condenser microphone CM. In order to prevent overcurrents from flowing from the power supply 20 to the capacitor 10, a resistor R is connected between the power supply 20 and the front electrode 11.

When the capacitance of the capacitor 10 changes, an output voltage V1 of the condenser microphone CM changes (V=Q/C, in which V is a voltage between the front electrode 11 and the rear electrode 12, Q is an amount of charges stored on the capacitor 10 and C is the capacitance of the capacitor 10). Accordingly, an external system connected to the condenser microphone CM can recognize the change in the output voltage V1 as a change in the voice or other auditory or acoustic signal. Since the change in the output voltage V1 is small, an amplifier (not shown) may be included. The amplifier may be a transistor or an operational amplifier.

Since the OLED display panel may vibrate by sound, a condenser microphone can be implemented by coupling the OLED display panel and a flat electrode to form a capacitor.

FIGS. 3A to 3D are a schematic cross-sectional views of a display microphone device according to a first embodiment of the present disclosure in which a condenser microphone is implemented using an OLED display panel.

As shown in FIGS. 3A to 3D, a display microphone device 100 may include an OLED display panel 110, and a front electrode 120 made of a conductive material positioned on a rear surface of the OLED display panel 110, and a rear electrode 130 spaced apart from the front electrode 120. The front electrode 120 and the rear electrode 130 form a capacitor. The rear surface of the OLED display panel 110 may be opposite a front surface of the OLED display panel 110, and the front surface may be a surface from which light is emitted by the OLED display panel 110. Thus, the rear surface may be opposite the light emitting surface (or front surface) of the OLED display panel 110.

In addition, the display microphone device 100 may include a cover bottom 141 and a middle cabinet 142 for supporting and accommodating the OLED display panel 110 under the rear surface of the OLED display panel 110. As shown in FIG. 3B, the display microphone device 100 may further include an inner plate 143 that improves rigidity and absorbs and emits heat generated from the OLED display panel 110.

Figure 3A:
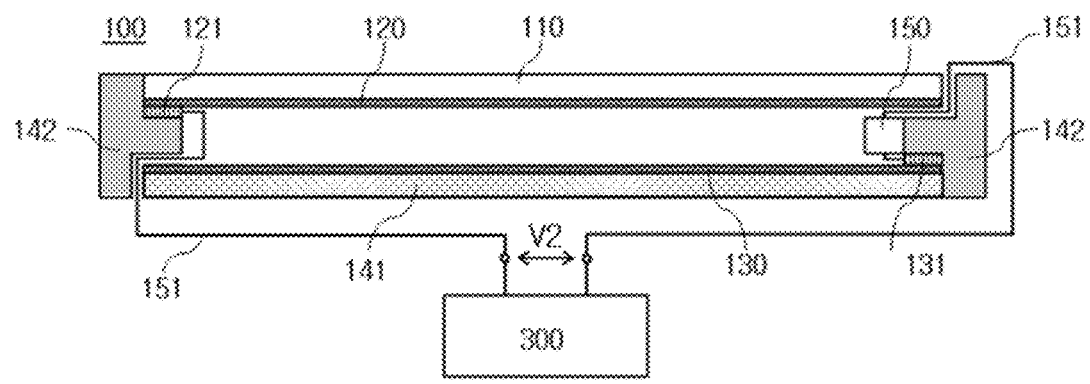
FIGS. 3A to 3D are a schematic cross-sectional views of a display microphone device according to a first embodiment of the present disclosure in which a condenser microphone is implemented using an OLED display panel.
Figure 3B:
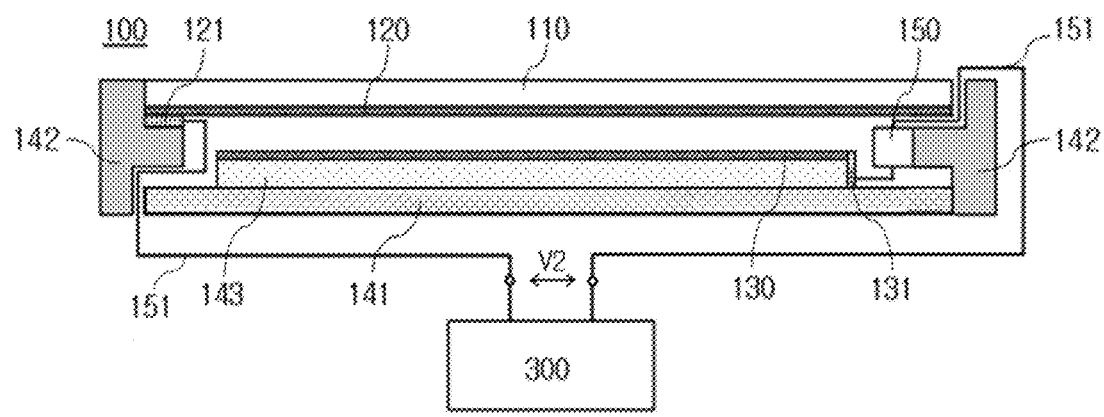

As shown in FIG. 3A, the rear electrode 130 may be coupled to the surface of the cover bottom 141 faces the OLED display panel 110. Alternatively, as shown in FIG. 3B, the rear electrode 130 may be coupled to the surface of the inner plate 143 facing the OLED display panel 110. Not limited to this, the rear electrode 130 may be coupled to other components facing the rear surface of the OLED display panel 110 to form a capacitor with the front electrode 120.

When a current flows to the cover bottom 141 and the middle cabinet 142 and the inner plate 143, an output voltage V2 of the display microphone device 100 does not change, and the display microphone device 100 cannot operate normally. Accordingly, the cover bottom 141 and the middle cabinet 142 and the inner plate 143 may be made of a non-conductive material. Alternatively, an insulating material may be positioned between the front electrode 120 and the middle cabinet 142, between the rear electrode 130 and the cover bottom 141, between the rear electrode 130 and the middle cabinet 142, and between the rear electrode 130 and the inner plate 143.

The front electrode 120 is connected to the front electrode pad 121 (which may be referred to herein as a front electrode pad part 121) made of a conductive material. The front electrode pad part 121 is connected to the power supply 150 through a conductive wire 151. The rear electrode 130 is connected to the rear electrode pad 131 (which may be referred to herein as a rear electrode pad part 131) made of a conductive material. The rear electrode pad part 131 is connected to the power supply device 150 through the conductive wire 151.

The OLED display panel 110 vibrates due to sounds generated from the outside of the display microphone device 100, and the front electrode 120 coupled with the OLED display panel 110 also vibrates together. Accordingly, since the distance between the front electrode 120 and the rear electrode 130 is changed, the capacitance of the capacitor formed by the front electrode 120 and the rear electrode 130 is changed.

However, the capacitance of the capacitor can change only when an electric field is formed between the front electrode 120 and the rear electrode 130. In order to form an electric field between the front electrode 120 and the rear electrode 130, the power supply 150 applies a voltage between the front electrode 120 and the rear electrode 130.

The power supply 150 may be an AC-DC converter that converts external AC power connected to the display microphone device 100 to DC. Alternatively, the power supply device 150 may be a battery.

Figure 3C:
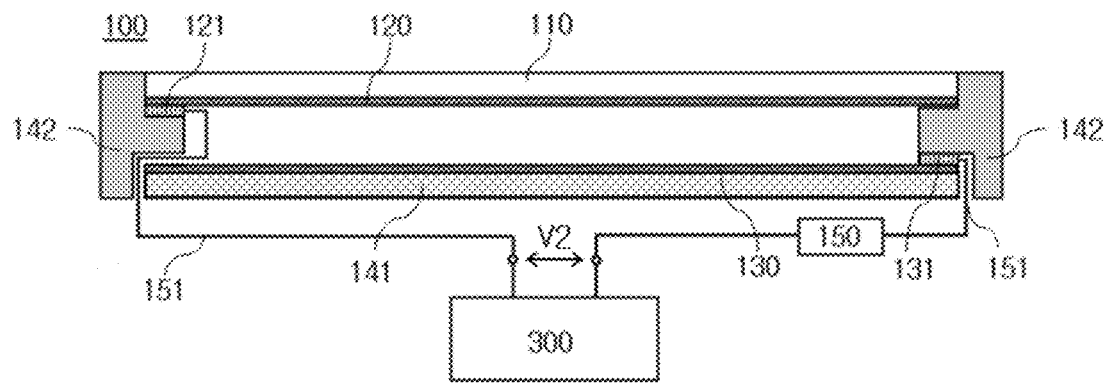

Although the power supply 150 is located inside the display microphone device 100 as shown in FIG. 3A, the power supply 150 may be located outside the display microphone device 100 as shown in FIG. 3C. Although the power supply 150 is connected to the rear electrode 130 through the rear electrode pad part 131, the power supply 150 may be connected to the front electrode 120 through the front electrode pad part 121.

When the OLED display panel 110 vibrates due to sounds generated from the outside of the display microphone device 100, and the capacitance of the capacitor changes, the output voltage V2, which is a voltage between the front electrode 120 and the rear electrode 130, is also changed. The output voltage V2 of the display microphone device 100 is output to a host system 300. The host system 300 can recognize the change in the voltage V2 of the capacitor as a change in the voice signal and perform signal processing.

Figure 3D:
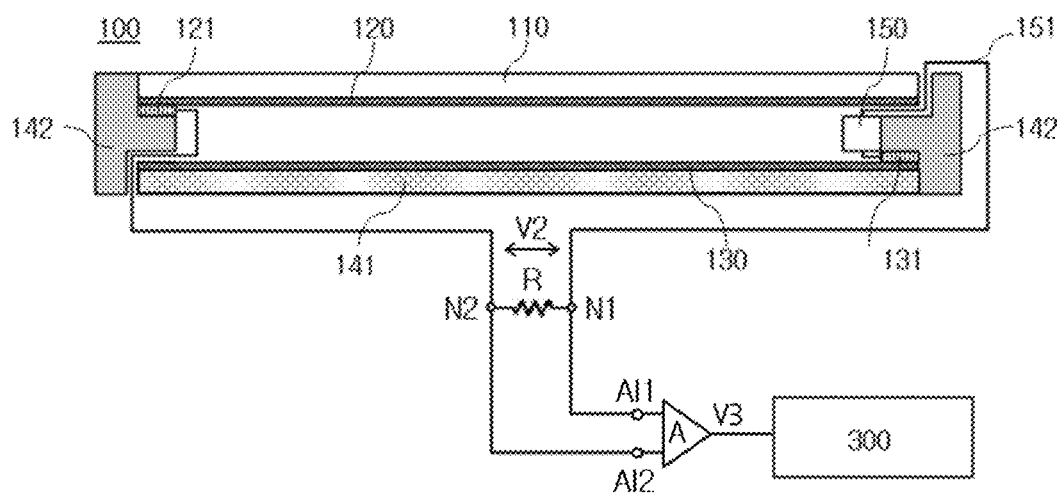

The OLED display panel 110 vibrates finely so that a human cannot recognize it. For example, the vibration of the OLED display panel 110 may be imperceptible to the human eye. Accordingly, since the capacitance of the capacitor and the output voltage V2 of the display microphone device 100 change finely, the output voltage V2 of the display microphone device 100 may be distorted by noise. As shown in FIG. 3D, to reduce distortion caused by noise, an amplifier A may be connected in terminals for outputting the output voltage V2 to amplify the output voltage V2. The amplifier A may be a transistor or an operational amplifier.

The display microphone device 100 having the amplifier A may further include a resistor R, a first node N1, and a second node N2. One end (e.g., a first terminal) of the power supply 150 may be connected to the rear electrode 130 through the rear electrode pad part 131, and the other end (e.g., a second terminal) thereof may be connected to the first node N1.

One end of the resistor R1 may be connected to the first node N1, and the other end thereof may be connected to the second node N2, and the resistor R1 can prevent the overcurrent from flowing to the front electrode 120 or the rear electrode 130.

The front electrode 120 may be connected to the second node N2 through the front electrode pad part 121, and a first input terminal AI1 of the amplifier A may be connected to the first node N1, and a second input terminal AI2 of the amplifier A may be connected to the second node N2.

The amplifier A amplifies the output voltage V2 between the first node N1 and the second node N2, and outputs the amplified output voltage V3 to the host system 300. The host system 300 can recognize the change in the amplified output voltage V3 as a change in the audio signal and perform signal processing.

In FIGS. 3A to 3D, although the front electrode 120 is coupled to the entire rear surface of the OLED display panel 110, the front electrode 120 may be coupled to a portion of the rear surface of the OLED display panel 110. In particular, the front electrode 120 may be positioned where the amplitude is greatest when the OLED display panel 110 vibrates.

When the middle cabinet 143 is positioned at the edge of the display microphone device 100, since the amplitude at the center portion of the OLED display panel 110 may be greatest, the front electrode 120 may be coupled to the center portion.

A substrate of the OLED display panel 110 may be made of a plastic material, for example polyimide (PI). Since the substrate made of plastic is light, thin, not easily broken and flexible, vibration characteristics of the OLED display panel 110 can be improved.

The first embodiment of the present disclosure can be applied not only to display devices such as TVs and monitors, but also to other devices.

For example, a capacitor can be implemented in a small size, so that it can be applied to small mobile devices such as smartphones or smartwatches.

In smartphones or smartwatches including an OLED display panel, a front electrode is coupled to a rear surface of the OLED display panel and a rear electrode is positioned facing the front electrode. When the OLED display panel vibrates by a voice, the capacitance and voltage between the front electrode and the rear electrode change.

By outputting a change in the voltage between the front electrode and the rear electrode to the processing unit included in smartphones or smartwatches, it can be used as an audio signal in applications of smartphones or smartwatches.

Therefore, it is not necessary to have additional microphone modules in small mobile devices such as smartphones or smartwatches, thereby reducing manufacturing costs. Spaces for additional microphone modules can be used for other purposes, reducing design constraints. Since smartphones or smartwatches is small in size, microphone modules, which are separately provided, can be removed to more effectively use the spaces.

As another example, the first embodiment of the present disclosure can be applied in lighting devices. Lighting devices may include an OLED display panel, a front electrode is coupled to a rear surface of the OLED display panel and a rear electrode is positioned facing the front electrode.

When the OLED display panel and the front electrode vibrate due to sounds generated from the lighting devices, the capacitance and voltage between the front electrode and the rear electrode change. The change in the voltage between the front electrode and the rear electrode can be output to a host system to be recognized as an audio signal. Accordingly, by installing lighting device to which the present disclosure is applied in auditoriums or classrooms, it is possible to recognize and process voice without separate microphones.

Although the first embodiment shows an example using an OLED display panel, without being limited thereto, a condenser microphone can be implemented by using other display panels with vibration characteristics.

For example, a front electrode made of a transparent conductive material is positioned on a rear surface of a LCD panel having vibration characteristic, a rear electrode made of a transparent conductive material is positioned on a light guide plate or other apparatus facing the LCD panel. When the distance between the front electrode and the rear electrode changes according to the vibration of the LCD panel, the voltage between the front electrode and the rear electrode may change together to output a voice signal. The front electrode and the rear electrode may be made of a transparent conductive material such as indium tin oxide (ITO) or indium zinc oxide (IZO).

Figure 4:
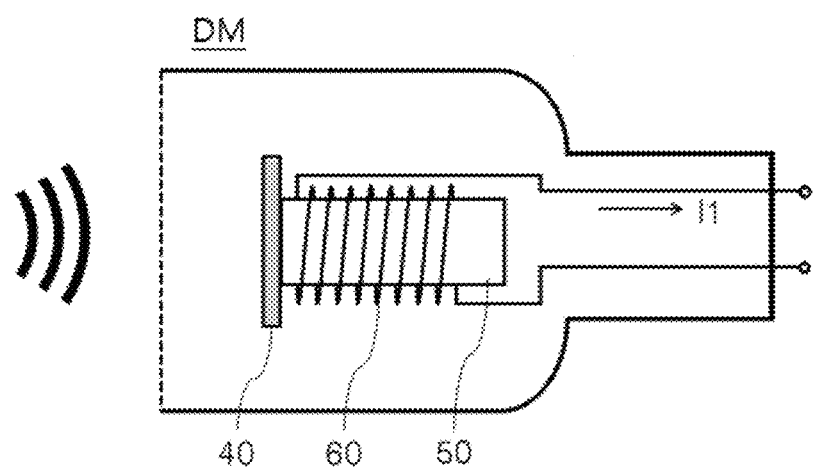
FIG. 4 is a schematic view showing a structure of a dynamic microphone.

FIG. 4 is a schematic view showing a structure of a dynamic microphone.

A dynamic microphone DM includes a diaphragm 40 and a coil 60 wound around a permanent magnet 50. The diaphragm 40 may be a vibrating plate, and the permanent magnet 50 is connected to the rear surface of the diaphragm 40.

The diaphragm 40 vibrates by a sound generated from the outside of the dynamic microphone DM, and the permanent magnet 50 connected thereto vibrates too. Accordingly, a magnetic field generated by the permanent magnet 50 changes, so that an electromagnetic induction phenomenon occurs, and a current I1 flows in the coil 60.

When the amplitude and frequency of the sound generated from the outside of the dynamic microphone DM change, the amplitude and frequency of the vibration of the diaphragm 40 change, and the current I1 flowing in the coil 60 changes.

A host system connected to the dynamic microphone DM can recognize the change in the current I1 flowing in the coil 60 as the change in the voice signal. Since the change in the current I1 is small, an amplifier (not shown) may be included.

In the dynamic microphone DM, the current I1 flows due to electromagnetic induction, and thus no separate power supply is required.

Figure 5A:
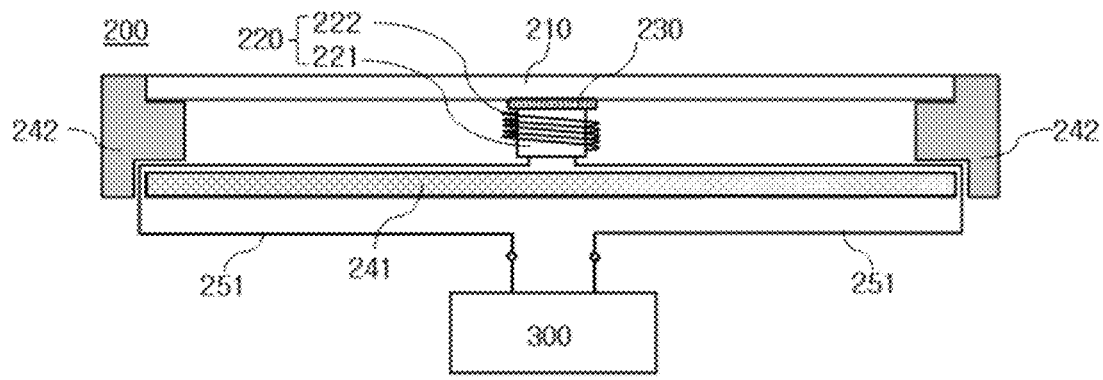
FIGS. 5A and 5B are a schematic cross-sectional views of a display microphone device according to a second embodiment of the present disclosure in which a dynamic microphone is implemented using an OLED display panel.
Figure 5B:
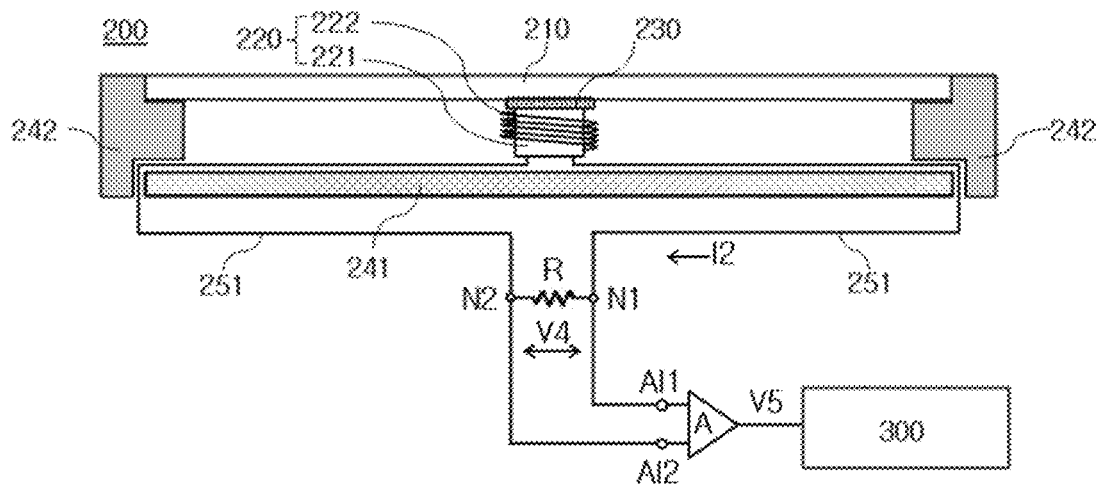

FIGS. 5A and 5B are a schematic cross-sectional views of a display microphone device according to a second embodiment of the present disclosure in which a dynamic microphone is implemented using an OLED display panel.

As shown in FIGS. 5A and 5B, a display microphone device 200 may include an OLED display panel 210, and an electromagnet 220 positioned on the rear surface of the OLED display panel 210, and a buffer pad 230 (which may be referred to herein as a buffer pad part 230) positioned between the OLED panel 210 and the electromagnet 220. The buffer pad part 230 is connected to the OLED 210 and the electromagnet 220.

The buffer pad part 230 transmits vibrations from the OLED display panel 210 to the electromagnet 220. The buffer pad part 230 alleviates the shock applied to the OLED display panel 210.

In addition, the display microphone device 200 may include a cover bottom 241 and a middle cabinet 242 for supporting and accommodating the OLED display panel 210 under the rear surface of the OLED display panel 210.

The electromagnet 220 may include a core 221 made of a permanent magnet and generating a magnetic field, and a coil 222 made of an electric wire or a conductive material. The perimeter or circumference of the core 221 may be repeatedly wound several times with the coil 222. For example, the coil 222 may be wound around the core 221 a plurality of times.

When the electromagnet 220 vibrates in a direction perpendicular to the circumference of the core 221, the density of the magnetic flux passing through the coil 222 is changed. Since electromotive force is generated by the change of the magnetic flux according to Faraday's law, a current I2 flows through the coil 222.

The vibration frequency and amplitude of the OLED panel 210 and the electromagnet 220 connected thereto are changed according to the frequency and amplitude of sounds generated from the outside of the display microphone device 200.

When the vibration frequency and amplitude of the electromagnet 220 change, the density of the magnetic flux passing through the coil 222 and the current I2 flowing through the coil 222 also change accordingly. As shown in FIG. 5A, the current I2 flowing in the coil 222 is output to a host system 300. The host system 300 can recognize the change in the current I2 flowing in the coil 222 as a change in the voice signal and perform signal processing.

In the second embodiment, unlike the first embodiment, since electromotive force is generated and current flows due to electromagnetic induction caused by the vibration of the electromagnet 220, there is no need for a separate power supply to drive the display microphone device 200.

The OLED display panel 210 vibrates finely so that a human cannot recognize it. Accordingly, since the electromagnet 220 connected to the OLED display panel 210 vibrates finely too, the current I2 flowing in the coil 222 may be distorted by noise. As shown in FIG. 5B, to reduce distortion caused by noise, an amplifier A may be connected in terminals for outputting the current I2 flowing in the coil 222, and the amplifier A can amplify the voltage V4 between both terminals of coil 222. The amplifier A may be a transistor or an operational amplifier.

The display microphone device 200 having the amplifier A may include a resistor R, a first node N1, and a second node N2. One end (e.g., a first end) of the coil 222 may be connected to the first node N1, and the other end (e.g., a second end) thereof may be connected to the second node N2.

One end of the resistor R1 may be connected to the first node N1, and the other end the other end thereof may be connected to the second node N2, and the resistor R1 can prevent the overcurrent from flowing to the coil 222.

A first input terminal AI1 of the amplifier A may be connected to the first node N1, and a second input terminal AI2 of the amplifier A may be connected to the second node N2.

Since the resistor R is connected between the first node N1 and the second node N2, the voltage V4 between the first node N1 and the second node N2 is changed due to the change of the current I2 flowing in the coil 222.

The amplifier A amplifies the voltage V4 between the first node N1 and the second node N2, and outputs the amplified voltage V4 to the host system 300. The host system 300 can recognize the change in the amplified voltage V4 as a change in the audio signal and perform signal processing.

In FIGS. 5A and 5B, although the electromagnet 220 is connected to the buffer pad part 230 positioned at the center portion of the rear surface of the OLED display panel 210, without being limited thereto, the electromagnet 220 may be connected to another portion of the rear surface of the OLED display panel 210. In particular, the electromagnet 220 may be connected through the buffer pad part 230 positioned where the vibration amplitude of the OLED display panel 210 is greatest.

In the second embodiment, a substrate of the OLED display panel 210 may be made of a glass material having a rigid property to recognize a loud sound generated from the outside of the display microphone device 200.

The second embodiment of the present disclosure can be applied not only to display devices such as TVs and monitors, but also to other devices.

For example, the display microphone device 200 according to the second embodiment can be used for a mirror. In particular, by applying the mirror in the form of a two way mirror at an interrogation room of a police station or a prosecutor's office, it is possible to recognize conversations in the interior of the interrogation room without a separate microphone and deliver to the outside of the interrogation room.

Although the second embodiment shows an example using an OLED display panel, without being limited thereto, a dynamic microphone can be implemented by using other display panels with vibration characteristics.

For example, an electromagnet including a coil and a core is connected to an edge or a corner of a rear surface of a LCD panel having vibration characteristic. The LCD panel vibrates by sound generated from the outside of the dynamic microphone, and thus the change in the current induced by the coil can be processed as an audio signal.

Since the LCD panel cannot emit light by itself, the LCD device may include a backlight and a light guide plate, the electromagnet may be positioned in an area except for an area where light passes from the backlight and the light guide plate.

It will be apparent to those skilled in the art that various modifications and variations can be made in the display microphone device including the same of the present disclosure without departing from the technical idea or scope of the disclosure. Thus, it is intended that the present disclosure cover the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display microphone device, comprising:
a display panel having a front surface from which light is emitted and a rear surface opposite the front surface;
a front electrode coupled to the rear surface of the display panel;
a rear electrode facing and spaced apart from the front electrode; and
a power supply connected to the front electrode and the rear electrode,
wherein the display microphone device outputs an audio signal based on a change in a voltage between the front electrode and the rear electrode.

2. The display microphone device according to claim 1, further comprising a cover bottom, wherein the rear electrode is coupled to a surface of the cover bottom facing the display panel.

3. The display microphone device according to claim 2, further comprising an inner plate, wherein the rear electrode is coupled to a surface of the inner plate facing the display panel.

4. The display microphone device according to claim 1, further comprising an amplifier, wherein the amplifier amplifies the voltage between the front electrode and the rear electrode and outputs the voltage as an audio signal.

5. The display microphone device according to claim 4, further comprising a resistor connected between a first node and a second node,
wherein a first terminal of the power supply is connected to the rear electrode, and a second terminal of the power supply is connected to the first node,
wherein the front electrode is connected to the second node,
wherein a first input terminal of the amplifier is connected to the first node, and a second input terminal of the amplifier is connected to the second node, and
wherein the amplifier amplifies the voltage between the first node and the second node and outputs an audio signal based on a change in the amplified voltage.

6. The display microphone device according to claim 1, wherein the display panel is an organic light emitting diode display panel.

7. The display microphone device according to claim 1, wherein at least one of the front electrode or the rear electrode is formed of a transparent conductive material.

8. A display microphone device, comprising:
a display panel having a front surface from which light is emitted and a rear surface opposite the front surface; and
an electromagnet including a magnetic core and a coil wound around the core a plurality of times,
wherein the electromagnet is coupled to the rear surface of the display panel and outputs an audio signal based on a change in a current generated from the coil.

9. The display microphone device according to claim 8, further comprising a buffer pad, wherein the buffer pad is coupled between the rear surface of the display panel and the electromagnet.

10. The display microphone device according to claim 8, further comprising an amplifier, wherein the amplifier amplifies the current flowing in the coil and outputs an audio signal based on a change in the amplified current.

11. The display microphone device according to claim 10, further comprising a resistor connected between a first node and a second node,
wherein a first end of the coil is connected to the first node, and a second end of the coil is connected to the second node,
wherein a first input terminal of the amplifier is connected to the first node, and a second input terminal of the amplifier is connected to the second node, and
wherein the amplifier amplifies a voltage between the first node and the second node and outputs an audio signal based on a change in the amplified voltage as an audio signal.

12. The display microphone device according to claim 8, wherein the display panel is an organic light emitting diode display panel.

* * * * *